United States Patent
Dewey et al.

(10) Patent No.: US 10,411,007 B2
(45) Date of Patent: Sep. 10, 2019

(54) HIGH MOBILITY FIELD EFFECT TRANSISTORS WITH A BAND-OFFSET SEMICONDUCTOR SOURCE/DRAIN SPACER

(71) Applicant: Intel Corporation, Santa Clara, CA (US)

(72) Inventors: Gilbert Dewey, Hillsboro, OR (US); Willy Rachmady, Beaverton, OR (US); Matthew V. Metz, Portland, OR (US); Chandra S. Mohapatra, Beaverton, OR (US); Sean T. Ma, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,490

(22) PCT Filed: Sep. 25, 2015

(86) PCT No.: PCT/US2015/052342
§ 371 (c)(1),
(2) Date: Feb. 26, 2018

(87) PCT Pub. No.: WO2017/052618
PCT Pub. Date: Mar. 30, 2017

(65) Prior Publication Data
US 2018/0350798 A1     Dec. 6, 2018

(51) Int. Cl.
*H01L 27/06*     (2006.01)
*H01L 29/66*     (2006.01)
(Continued)

(52) U.S. Cl.
CPC .......... *H01L 27/0605* (2013.01); *B82Y 10/00* (2013.01); *H01L 21/8252* (2013.01);
(Continued)

(58) Field of Classification Search
CPC ............. H01L 29/452; H01L 29/41783; H01L 29/0605; H01L 29/66522
See application file for complete search history.

(56) References Cited

U.S. PATENT DOCUMENTS

| | | |
|---|---|---|
| 8,264,032 B2 | 9/2012 | Yeh |
| 8,674,341 B2 | 3/2014 | Ko |

(Continued)

OTHER PUBLICATIONS

Porod W. "Modification of the virtual-crystal approximation for ternary III-V compounds" Phys. Rev., B27, No. 4, pp. 2587-2589 Feb. 15, 1983.*

(Continued)

*Primary Examiner* — Grant S Withers
(74) *Attorney, Agent, or Firm* — Green, Howard & Mughal LLP

(57) ABSTRACT

Monolithic FETs including a channel region in a first semiconductor material disposed over a substrate. While a mask, such as a gate stack or sacrificial gate stack, is covering a channel region, a semiconductor spacer of a semiconductor material with a band offset relative to the channel material is grown, for example on at least a drain end of the channel region to introduce at least one charge carrier-blocking band offset between the channel semiconductor and a drain region of a third III-V semiconductor material. In some N-type transistor embodiments, the carrier-blocking band offset is a conduction band offset of at least 0.1 eV. A wider band gap and/or a blocking conduction band offset may contribute to reduced gate induced drain leakage (GIDL). Source/drain regions couple electrically to the channel region through the semiconductor spacer, which may be substantially undoped (Continued)

(i.e. intrinsic) or doped. In some embodiments, the semiconductor spacer growth is integrated into a gate-last, source/drain regrowth finFET fabrication process.

15 Claims, 10 Drawing Sheets

(51) Int. Cl.

| | |
|---|---|
| H01L 21/8252 | (2006.01) |
| H01L 29/775 | (2006.01) |
| H01L 29/06 | (2006.01) |
| H01L 29/205 | (2006.01) |
| H01L 21/8258 | (2006.01) |
| H01L 29/16 | (2006.01) |
| H01L 29/423 | (2006.01) |
| H01L 29/78 | (2006.01) |
| H01L 29/786 | (2006.01) |
| B82Y 10/00 | (2011.01) |
| H01L 27/092 | (2006.01) |
| H01L 21/8238 | (2006.01) |

(52) U.S. Cl.
CPC ...... *H01L 21/8258* (2013.01); *H01L 27/0924* (2013.01); *H01L 29/0673* (2013.01); *H01L 29/16* (2013.01); *H01L 29/205* (2013.01); *H01L 29/42392* (2013.01); *H01L 29/66469* (2013.01); *H01L 29/66522* (2013.01); *H01L 29/66795* (2013.01); *H01L 29/775* (2013.01); *H01L 29/7851* (2013.01); *H01L 29/78681* (2013.01); *H01L 29/78696* (2013.01); *H01L 21/823807* (2013.01)

(56) References Cited

U.S. PATENT DOCUMENTS

| | | | |
|---|---|---|---|
| 9,653,580 | B2 | 5/2017 | Balakrishnan |
| 2002/0185679 | A1 | 12/2002 | Baliga et al. |
| 2004/0211955 | A1 | 10/2004 | Hsu et al. |
| 2005/0093033 | A1 | 5/2005 | Kinoshita et al. |
| 2009/0108350 | A1 | 4/2009 | Cai et al. |
| 2010/0148153 | A1 | 6/2010 | Hudait et al. |
| 2010/0163847 | A1 | 7/2010 | Majhi |
| 2010/0193840 | A1 | 8/2010 | Doyle |
| 2010/0252862 | A1 | 10/2010 | Ko |
| 2011/0133292 | A1 | 6/2011 | Lee |
| 2012/0007183 | A1 | 1/2012 | Chang et al. |
| 2012/0139047 | A1 | 6/2012 | Luo |
| 2012/0248502 | A1 | 10/2012 | Cheng |
| 2013/0056795 | A1 | 3/2013 | Wu et al. |
| 2013/0134488 | A1 | 5/2013 | Fumitake |
| 2014/0070276 | A1 | 3/2014 | Ko et al. |
| 2014/0175515 | A1 | 6/2014 | Then |
| 2014/0252478 | A1 | 9/2014 | Doornbos et al. |
| 2014/0374841 | A1 | 12/2014 | Wang et al. |
| 2015/0021662 | A1 | 1/2015 | Basu et al. |
| 2015/0093868 | A1 | 4/2015 | Obradovic et al. |
| 2015/0228795 | A1 | 8/2015 | Yang et al. |
| 2015/0236114 | A1 | 8/2015 | Ching et al. |
| 2015/0243756 | A1* | 8/2015 | Obradovic ........ H01L 29/66795 438/285 |
| 2015/0255456 | A1* | 9/2015 | Jacob .................. H01L 27/0886 257/401 |
| 2015/0255545 | A1 | 9/2015 | Holland et al. |
| 2015/0255548 | A1 | 9/2015 | Holland |
| 2015/0263138 | A1 | 9/2015 | Kim |
| 2015/0263159 | A1 | 9/2015 | Ching et al. |
| 2017/0047404 | A1* | 2/2017 | Bentley .............. H01L 29/1054 |
| 2018/0145077 | A1* | 5/2018 | Dewey ............ H01L 21/823814 |
| 2018/0254332 | A1 | 9/2018 | Mohapatra et al. |

OTHER PUBLICATIONS

Nahory, R.E. "Band gap versus composition and demonstration of Vegard's law for In1-xGaxAsyP1-y lattice matched to InP" App. Phys. Lett. 33(7) Oct. 1, 1978 pp. 659-661.*
The Semiconductors—Information Web-Site Article was available online at http://www.semiconductors.co.uk/ eg(ingaas).htm as of Jun. 6, 2014 (see Wayback machine archive attached).*
Ayers, J. "Epitaxy" Article available at http://www.engr.uconn.edu/~jayers/epitaxy.htm online Jun. 15, 2015 (see Wayback machine archive attached).*
Huang, C-Y "III-V Ultra-Thin-Body InGaAs/InAs MOSFETs for Low Standby Power Logic Applications" Univ. of Cali. Sant. Barb. Doctoral Thesis Sep. 1, 2015 pp. 1-167.*
International search Report and Written Opinion for International Patent Application No. PCT/US2015/052299, dated Jun. 15, 2016.
International Search Report and Written Opinion for International Patent Application No. PCT/US2015/052345, dated Jun. 20, 2016.
International Search Report and Written Opinion, dated Jun. 15, 2016 for PCT Patent No. PCT/US15/52302.
International Search Report and Written Opinion from PCT/US2015/052342 notified Jun. 15, 2016, 9 pgs.
International Preliminary Report on Patentability for International Patent Application No. PCT/US15/52299, dated Apr. 5, 2018.
International Preliminary Report on Patentability for International Patent Application No. PCT/US15/52345, dated Apr. 5, 2018.
International Preliminary Report on Patentability from PCT/US2015/052302 notified Apr. 5, 2018, 12 pgs.
International Preliminary Report on Patentability from PCT/US2015/052342 notified Apr. 5, 2018, 6 pgs.

* cited by examiner

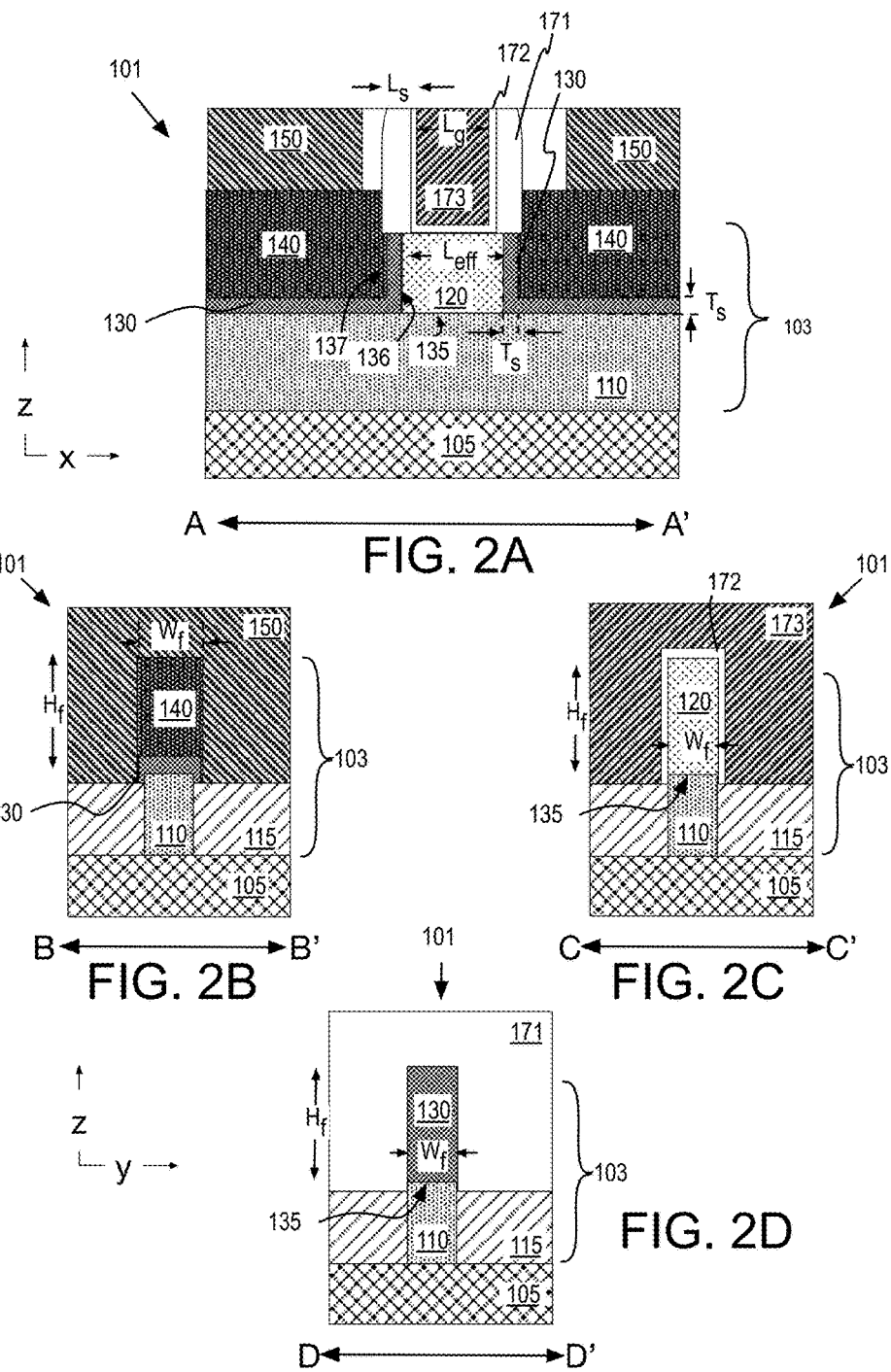

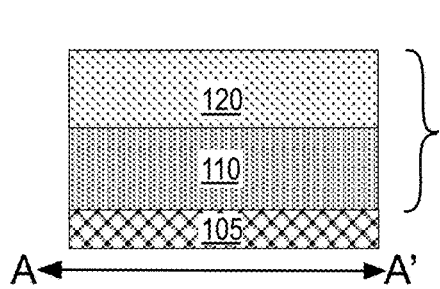
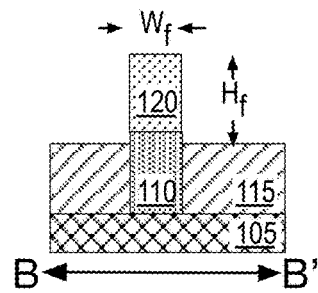
FIG. 7A  FIG. 8A
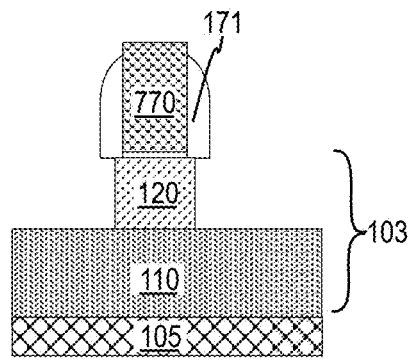
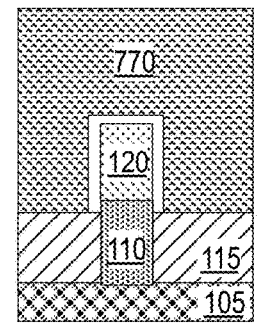
FIG. 7B  FIG. 8B
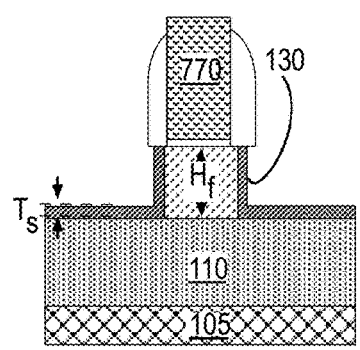
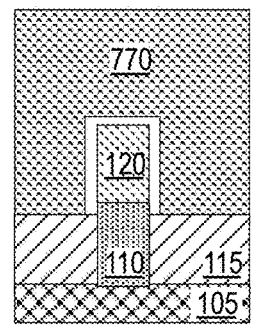
FIG. 7C  FIG. 8C

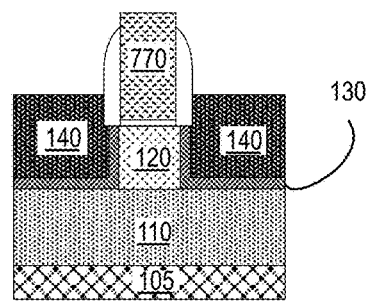 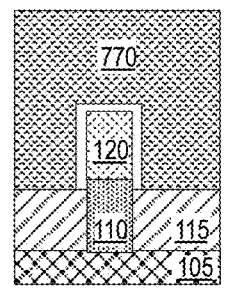
FIG. 7D  FIG. 8D
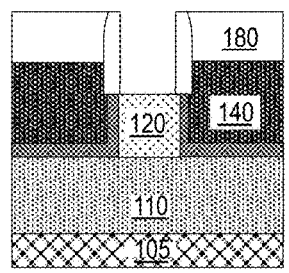 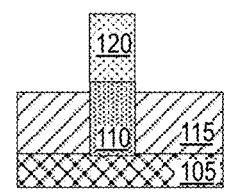
FIG. 7E  FIG. 8E
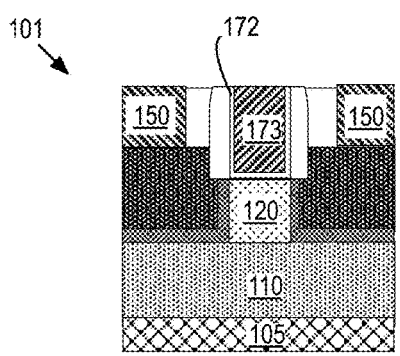 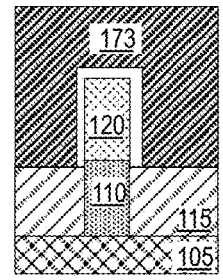
FIG. 7F  FIG. 8F

HIGH MOBILITY FIELD EFFECT TRANSISTORS WITH A BAND-OFFSET SEMICONDUCTOR SOURCE/DRAIN SPACER

CLAIM OF PRIORITY

This Application is a National Stage Entry of, and claims priority to, PCT Application No. PCT/US2015/052342, filed on Sep. 25, 2015 and titled "HIGH MOBILITY FIELD EFFECT TRANSISTORS WITH A BAND-OFFSET SEMICONDUCTOR SOURCE/DRAIN SPACER", which is incorporated by reference in its entirety for all purposes.

BACKGROUND

Efforts to extend Moore's law for integrated circuitry (IC) have included development of transistors employing materials other than silicon, such as III-V compound semiconductor materials (e.g., InP, InGaAs, InAs). These high mobility material systems typically display higher carrier mobility than silicon devices, and so their introduction has long been suggested as path toward faster transistors. However, along with higher carrier mobility, in a field effect transistor (FET) the off-state ($I_{off}$) leakage between source and drain can be significantly higher than for a silicon-based FET of equal effective (electrical) channel length. At high off-state drain to gate biases, band-to-band tunneling between the drain and gate insulator may cause Gate Induced Drain Leakage (GIDL) current. In a silicon-based FET, subthreshold leakage is typically much larger than GIDL current. However, with smaller band gap semiconductors in the gated channel, GIDL current can contribute significantly to $I_{off}$.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2A illustrates a cross-sectional view through a length of channel region and source/drain regions of the high mobility finFET depicted in FIG. 1, in accordance with some embodiments;

FIG. 2B illustrates a cross-sectional view through a fin width within a source/drain region of the high mobility finFET depicted in FIG. 1, in accordance with some embodiments;

FIG. 2C illustrates a cross-sectional view through a fin width within a channel region of the high mobility finFET depicted in FIG. 1, in accordance with some embodiments;

FIG. 2D illustrates a cross-sectional view through a fin width within a gate sidewall spacer region of the high mobility finFET depicted in FIG. 1, in accordance with some embodiments;

FIGS. 7A, 7B, 7C, 7D, 7E, and 7F illustrate cross-sectional views through a length of the channel region and source/drain regions of a high mobility finFET evolving as the method illustrated in FIG. 6 is performed, in accordance with some embodiments;

FIGS. 8A, 8B, 8C, 8D, 8E, and 8F illustrate cross-sectional views through a width of a fin structure within a region of a high mobility finFET evolving as the method illustrated in FIG. 6 is performed, in accordance with some embodiments;

DETAILED DESCRIPTION

Figure 1:
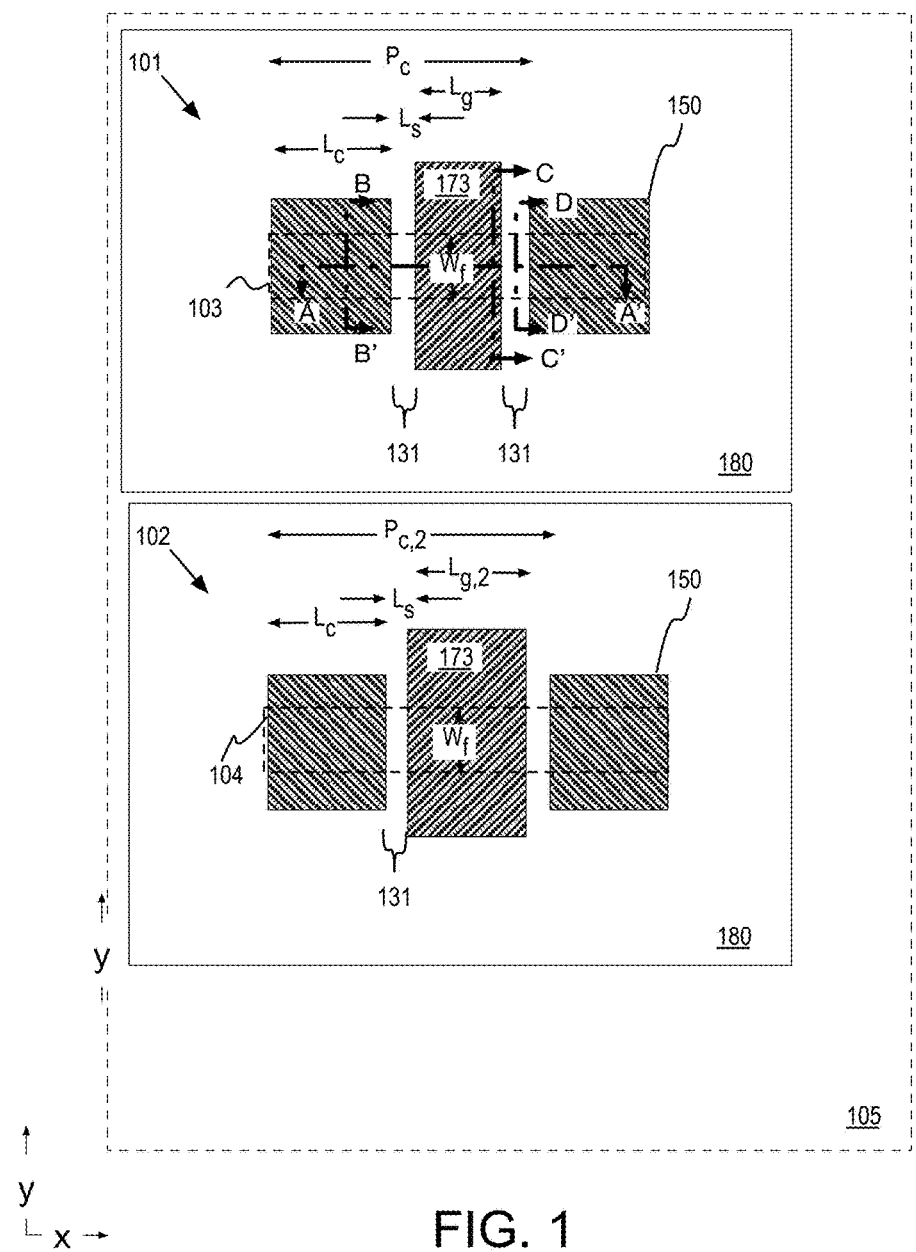
FIG. 1 is a plan view of a high mobility finFET disposed over a substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In embodiments described further below, a first semiconductor material is employed for a transistor channel region. For such a channel material, carrier mobility may be higher and band gap lower than that of silicon. Off-state leakage may also be more significant than for a reference silicon FET of a similar channel length. Techniques and transistor architectures to reduce off-state leakage for a given channel length are an important aspect of employing high mobility semiconductor material systems to extend Moore's law. Rather than simply achieving higher individual transistor performance (e.g., high $F_t$), achieving reductions in off-state leakage enable further lateral scaling, and greater transistor density. In some embodiments described herein, a wide band gap spacer is employed to limit transistor leakage current for a desired channel length. In further embodiments, a wide band gap semiconductor spacer is incorporated at least on a drain side of the channel region. In some advantageous embodiments, the wide band gap spacer is leveraged to reduce an area of the transistor cell, for example by reducing the length of the channel region between the source and drain regions, or enabling greater overlap between gate electrode and the source/drain regions without inducing transistor leakage significantly worse than that of a reference silicon-channeled device.

In some embodiments described further below, monolithic FETs include a channel region of a first semiconductor material disposed over a substrate. A gate electrode is disposed over the channel region. A pair of semiconductor source/drain regions are spaced apart from the channel region by a 2-20 nm thickness of a second semiconductor material having a charge carrier-blocking band offset from the first semiconductor material. Hence, for an n-type transistor, the second semiconductor material has at least a conduction band offset (CBO) attributable to the material have a smaller electron affinity (i.e., higher conduction band energy) than the channel semiconductor material.

In some embodiments, the carrier-blocking band offset is associated with the second semiconductor material having a wider band gap than the first (channel) material. The wide band gap and/or band offset material in the high field region between the gate electrode and drain may advantageously reduce band-to-band tunneling, thereby reducing generation of electron-hole pairs that contribute to leakage current. A wider band gap material between the gate electrode and drain may also impede multiplication of carriers generated through tunneling mechanisms to further reduce GIDL current. A band offset may impede transport of carriers generated by one or more leakage mechanism into the drain. In further embodiments where the semiconductor spacer forms a heterojunction with an underlying sub-fin semiconductor, source/drain regions comprising a third semiconductor material do not form any interface with the narrow channel semiconductor, reducing the ability for fields between drain and substrate to drive GIDL current. For exemplary transistors, the semiconductor spacer with the band-offset provides at least a 0.1 eV offset in the relevant band (conduction or valence) at the heterojunction between the channel region and the spacer. As GIDL is a strong function of the band gap, as well as the band offset from the material in the channel region, off-state leakage may be significantly reduced relative to an architecture lacking the band-offset semiconductor spacer.

In some finFET embodiments, the band-offset semiconductor spacer is disposed within a fin recess below a gate electrode or gate sidewall spacer and has substantially the same current carrying cross-sectional area as the channel. Charge carriers traversing a shortest $L_{eff}$ between the source and drain therefore traverse the semiconductor spacer. However, the minimal spacer thickness induces little shift in on-state resistance, perhaps because of higher charge carrier energy in the transistor on-state. In some embodiments described further below, while a mask, such as a gate stack or sacrificial gate stack, is covering the channel region, the band-offset III-V semiconductor material is overgrown, for example as a first phase of a source/drain regrowth process.

FIG. 1 is a plan view of complementary metal-oxide-semiconductor (CMOS) circuitry 100 including a high mobility finFET 101 and a silicon-channeled finFET 102 disposed over a substrate 105 and surrounded by an isolation material 180, in accordance with some embodiments. In the exemplary embodiment, high mobility finFET 101 is an NMOS device while finFET 102 is a PMOS device. For such embodiments, finFET 102 may have any architecture while high mobility finFET 101 has one or more of the structural attributes described further below. In alternate embodiments, high mobility NMOS finFET 101 is coupled with a high mobility PMOS finFET 102.

In some embodiments, substrate 105 is silicon (Si), which is advantageous for monolithic integration of finFETs 101 and 102. Crystallographic orientation of a substantially monocrystalline substrate 105 in exemplary embodiments is (100), (111), or (110). However, other crystallographic orientations are also possible. For example, the substrate working surface may be miscut, or offcut 2-10° toward [110] to facilitate nucleation of crystalline heteroepitaxial material. Other substrate embodiments are also possible. For example, substrate 105 may be any of silicon-carbide (SiC), sapphire, III-V compound semiconductor (e.g., GaAs), silicon on insulator (SOI), germanium (Ge), or silicon-germanium (SiGe). Isolation material 180 may be any material suitable for providing electrical isolation between transistors. In some exemplary embodiments, isolation material 180 is silicon dioxide. Other materials known to be suitable for the purpose may also be utilized, including low-k materials (e.g., having a relative dielectric constant below 2.5).

In the illustrated embodiment, finFET 101 is associated with a transistor cell area smaller than the transistor cell area associated with finFET 102. Specifically, gate length $L_g$ associated with finFET 101 is less than a corresponding gate length $L_{g,2}$ associated with finFET 102. For clarity, source/drain contact length $L_c$ and lateral spacing $L_s$ between source/drain contact metallization 150 and an edge of gate electrode 173 are both equivalent for the two finFETs 101, 102. In this example therefore, the gate length shrink in finFET 101 is manifested as a reduction in source/drain contact metallization pitch $P_c$ of finFET 101 relative to $P_{c,2}$ of finFET 102. A longest lateral length of fin 103 may then be shorter than the corresponding length of fin 104. In other embodiments where access resistance for finFET 101 is relatively high, the gate length shrink in finFET 101 may be utilized for increased source/drain contact length $L_c$ without increasing contact metallization pitch $P_c$ of finFET 101 beyond $P_{c,2}$. As noted above, off-state leakage current for a high mobility channel material may be considerably higher than for a silicon-channeled device of comparable effective channel length. Thus, in some embodiments, a second semiconductor having a band offset (i.e., higher conduction band energy, or lower electron affinity, than the high mobility semiconductor employed for the channel region disposed under gate electrode 173) is disposed at least within lateral spacing 131, offsetting the source/drain semiconductor from the channel semiconductor. The thickness, alloy composition, and impurity doping of the band offset semiconductor material may be tuned to reduce GIDL with minimal impact to on-state performance.

Although specific dimensions vary with device technology generation, in one example where $L_{g,2}$ is approximately 10 nm, $L_g$ may be 2-5 nm smaller, providing up to a 50% lateral gate shrink. A band offset semiconductor spacer is advantageously disposed between at least the channel region semiconductor and drain region semiconductor. In the illustrated example, a band offset semiconductor spacer is disposed within at least one lateral spacing 131, which may be 2-10 nm for example, to stand-off heavily-doped source/drain regions from the channel region by 2-20 nm. In some embodiments, the band offset semiconductor spacer is disposed only between the channel and drain. However, in advantageous embodiments where symmetry of transistor 101 is maintained, the band offset semiconductor spacer is disposed between the channel region and source region, as well as between the channel region and drain region. Such a symmetrical architecture allows a drain of one transistor to be employed as a source of another transistor. Depending on the extent of the band offset at the semiconductor spacer/semiconductor source heterojunction, finFET 101 may display off-state leakage comparable to, or better than, that of finFET 102.

A fin of first semiconductor material may be disposed directly on a substrate or some intervening material. In some exemplary embodiments, transistor 101 includes a semiconductor heterojunction fin ("hetero-fin") structure 103 that further includes a first semiconductor material disposed on a "sub-fin" of a second semiconductor material, as further described below. FIG. 2A illustrates a cross-sectional view through a length of channel region and source/drain of high mobility finFET 101 along the A-A' plane denoted in FIG. 1, in accordance with some embodiments. FIG. 2C illustrates a cross-sectional view through a fin width within a channel region of high mobility finFET 101, in accordance with some embodiments.

As shown in FIG. 2A-2C, hetero-fin 103 includes a channel region 120 disposed on a sub-fin 110. Sub-fin 110 is embedded in sub-fin isolation 115 (FIG. 2B, 2C), which may be any amorphous material suitable for providing electrical isolation between adjacent sub-fins. In some exemplary embodiments, sub-fin isolation 115 is silicon dioxide. Other known dielectric materials may also be employed, including low-k materials. Although embodiments are not limited in this respect, other exemplary materials include carbon-doped oxides, siloxane derivatives, and the like. Channel region 120 is of a first semiconductor material while the sub-fin 110 is of a second semiconductor material. The two different materials form a channel/sub-fin heterojunction 135. In some exemplary embodiments where sub-fin 110 does not to serve as part of the device channel, sub-fin 110 need not be of a material having high electron mobility. In some advantageous embodiments, sub-fin 110 is a second material of suitable composition so that heterojunction 135 is associated with a band energy offset between the channel region 120 and sub-fin 110 useful for reducing a substrate leakage current path through sub-fin 110. In some N-type transistor embodiments where channel region 120 is to provide an electron channel, sub-fin 110 may have a higher conduction band energy (i.e., a carrier-blocking conduction band offset).

In some embodiments, sub-fin 110 and channel region 120 are each monocrystalline compound semiconductors with a first sub-lattice of at least one element from group III of the periodic table (e.g., Al, Ga, In), and a second sub-lattice of at least one element of group V of the periodic table (e.g., P, As, Sb). Sub-fin 110 and channel region 120 may each be a binary, ternary, or quaternary III-V compound semiconductor that is an alloy of two, three, or even four elements from groups III and V of the periodic table. For exemplary N-type transistor embodiments, channel region 120 is advantageously a III-V material having a high electron mobility, such as, but not limited to GaAs, InGaAs, InP, InSb, and InAs. For some $In_xGa_{1-x}As$ fin channel semiconductor embodiments, In context, x, between 0.1 and 0.9, and advantageously at least 0.5 (e.g., $In_{0.53}Ga_{0.47}As$). In some embodiments with highest mobility, a channel region 120 is intrinsic III-V material and not intentionally doped with any electrically active impurity. In alternate embodiments, one or more a nominal impurity dopant level may be present within the channel region, for example to set a threshold voltage $V_t$, or to provide HALO pocket implants, etc.

Sub-fin 110 is advantageously a III-V material having a significant carrier-blocking band offset (e.g., conduction band offset) from that of the fin material, such as but not limited to GaAs, GaSb, GaAsSb, GaP, InAlAs, GaAsSb, AlAs, AlP, AlSb, and AlGaAs. In some N-type transistor embodiments, sub-fin 110 has a higher conduction band energy and is also doped with p-type impurities (e.g., Mg, Be, etc.).

Channel region 120 is disposed below (or covered by) gate electrode 173 and gate dielectric 172. As illustrated in FIGS. 2A and 2C, a metal-insulator gate stack includes a gate dielectric material 172 and a gate electrode material 173. While any known gate stack materials may be utilized, in one exemplary embodiment a high-k material having a bulk relative dielectric constant of 9, or more is employed as the gate dielectric along with a gate metal that has a work function suitable for the composition of channel region 120. Exemplary high-k materials include metal oxides, such as, but not limited to $HfO_2$. In the embodiments illustrated by FIG. 2C, gate dielectric 172 is disposed directly on sidewalls of fin 120 that define the transverse fin width $W_f$.

In some "gate underlap" embodiments illustrated by FIG. 2A, a portion of channel region 120 is further disposed below (or covered by) dielectric gate sidewall spacers 171, which are adjacent to opposite edges of gate electrode 173. Channel region 120 need not extend beyond length of gate electrode 173. In the exemplary embodiment illustrated, at least a portion of semiconductor spacer 130 is disposed below (or covered by) gate sidewall spacers 171 to form channel-spacer heterojunctions 136 located below gate sidewall spacers 171. Alternatively, channel-spacer heterojunctions 136 may be disposed below gate electrode 173, or may even be located external of gate sidewall spacers 171 where a transistor architecture has a larger underlap of the gate stack and semiconductor drain region. Gate sidewall spacers 171 may be of any dielectric material, and may be in contact with a sidewall of gate electrode 173, or as shown, in contact with gate dielectric 172 that covers sidewalls of gate electrode 173. The lateral dimensions of gate sidewall spacers 171 may vary anywhere from 1 to 10 nm, for example. In some exemplary embodiments, gate sidewall spacers 171 provide 2-5 nm of lateral spacing between gate electrode 173 and semiconductor source/drain region 140.

In the embodiments illustrated by FIG. 2A, semiconductor spacer 130 has a film thickness $T_s$ (as measured from an interface with channel region 120) that is less than the lateral width $L_s$ of gate sidewall spacers 171. However, semiconductor spacer 130 may also be sufficiently thick so as to extend laterally beyond sidewall spacers 171. Semiconductor spacer 130 may have a film thickness $T_s$ below 20 nm, more advantageously below 10 nm, and most advantageously between 2 nm and 5 nm. Semiconductor spacer thickness $T_s$ may be selected at least in part on lattice mismatch, limiting the spacer thickness $T_s$ to less than the critical thickness where the pseudomorphic crystalline semiconductor spacer relaxes. Spacer thickness $T_s$ may also be based in part on the magnitude of band offset at channel-spacer heterojunctions 136. For example, semiconductor spacers providing a larger band offset relative to the may be advantageously thinner to limit their impact on on-state performance. Semiconductor spacer thickness $T_s$ may be further selected based on the high gate-drain field geometry. For example, a wide band gap spacer of greater thickness may be employed if a high gate-drain field extends over a longer lateral distance.

Semiconductor spacer 130 is a monocrystalline compound semiconductor material. In some exemplary embodiments, semiconductor spacer 130 has a first sub-lattice of at least one element from group III of the periodic table (e.g., Al, Ga, In), and a second sub-lattice of at least one element of group V of the periodic table (e.g., P, As, Sb). Semiconductor spacer 130 may be a binary, ternary, or quaternary III-V compound semiconductor that is an alloy of two, three, or even four elements from groups III and V of the periodic table. Semiconductor spacer 130 has a different composition than channel semiconductor region 120 to have a band carrier-blocking band offset from the channel semiconductor region 120. In exemplary embodiments, semiconductor spacer 130 is of III-V semiconductor material that has a conduction band offset of at least 0.1 eV from channel semiconductor region 120. In some advantageous embodiments, semiconductor spacer 130 is of III-V semiconductor material that has a conduction band offset of at least 0.25 eV from channel semiconductor region 120. Although larger band offsets are advantageous for GIDL reduction, compositional modulation may be limited to defect density constraints, as the spacer semiconductor is advantageously a good quality single crystal.

In some embodiments where channel region 120 and semiconductor spacer 130 both comprise Ga or As alloys, channel region 120 has a higher concentration of In or Sb than does semiconductor spacer 130, and/or semiconductor spacer 130 has a higher concentration of Al or P than does channel region 120. In one example where channel region 120 and semiconductor spacer 130 both comprise InGaAs alloys, channel region 120 has a higher concentration of In than does semiconductor spacer 130. Where channel region 120 comprises $In_{0.53}Ga_{0.47}As$, for example, an $In_{0.4}Ga_{0.6}As$ semiconductor spacer 130 provides a conduction band offset of 0.1 eV. A greater offset is provided for $In_xGa_{1-x}As$ where x is less than 0.4. In another example where channel region 120 is an InGaAs alloy, a GaAs semiconductor spacer 130 may provide a conduction band offset of 0.7 eV, or more, depending on In content in channel region 120. In another example where channel region 120 is an InGaAs alloy, an InAlAs semiconductor spacer 130 may provide a conduction band offset of 1 eV, or more, depending on Indium content in channel region 120.

In other embodiments where one of channel region 120 and semiconductor spacer 130 is InP, the other is a Ga alloy or As alloy. For example, where channel region 120 comprises an InGaAs alloy, semiconductor spacer 130 may be InP. Where channel region 120 comprises $In_{0.53}Ga_{0.47}As$, for example, an InP semiconductor spacer 130 may provide a 0.45 eV conduction band offset and may be any thickness as the two materials are lattice matched. In still other embodiments, where channel region 120 and semiconductor spacer 130 both comprise In or P alloys, channel region 120 has a higher concentration of As than does semiconductor spacer 130, and/or semiconductor spacer 130 has a higher concentration of Al or Ga than does channel region 120.

In some embodiments, semiconductor spacer 130 has an impurity concentration that is substantially the same as channel region 120. For example, where the channel region 120 is intrinsic (i.e., no intentional doping), semiconductor spacer 130 may also be intrinsic. Such undoped wide band gap spacer embodiments will further serve to increase the distance between the gate stack and tips of the source/drain region. Transistor electrostatics will be improved while GIDL may be reduced both through greater a separation of gate and drain and the localized increase in material band gap. Relative to a given separation between gate and drain providing a reference GIDL current, insertion of the wide band gap spacer layer allows for a reduction in gate-drain separation at the reference GIDL current. In some alternate embodiments, semiconductor spacer 130 has a different impurity doping than channel region 120. Semiconductor spacer 130 may be lightly or heavily doped to the conductivity type of the source/drain (e.g., n-type for an NMOS device). For example, where channel region 120 is intrinsic narrow band gap InGaAs, semiconductor spacer 130 may be lightly or heavily n-type doped wide band gap InGaAs. Such doped wide band gap spacer embodiments reduce GIDL primarily through the increase in material band gap and display a reduced external resistance ($R_{ext}$) penalty relative to undoped spacer semiconductor embodiments.

FIG. 2B illustrates a cross-sectional view through a fin width within source/drain region 140, in accordance with some embodiments. As further illustrated by FIGS. 2A and 2B, a regrown heteroepitaxial source/drain region 140 interfaces with the semiconductor spacer 130, forming spacer-source and spacer-drain heterojunctions 137. Semiconductor source/drain region 140 comprises semiconductor with a lattice composition distinct from that of semiconductor spacer 130. In exemplary embodiments, semiconductor source/drain region 140 comprises a third III-V alloy composition distinct from both channel region 120 and spacer 130. Source/drain region 140 may be of any material suitable for ohmic contact to fin 120, such as, but not limited to, compositions providing a lower band gap than channel region 120, facilitating a low resistance with contact metallization 150 (e.g., Ti/TiN). In exemplary embodiments, where spacer 130 comprises an wide band gap InGaAs alloy with low In content, semiconductor source/drain region 140 comprises a narrow band gap $In_xGa_{1-x}As$ alloy with high In content (e.g., x of 0.8, or more). Semiconductor source/drain region 140 may also be InAs. In some embodiments, source/drain region 140 is single-crystalline. Source/drain region 140 is advantageously heavily doped (e.g., both source/drain n-type in NMOS embodiments). As shown in FIG. 2A, source/drain region 140 covers semiconductor spacer 130 such that metallization 150 interfaces with source/drain region 140 rather than semiconductor spacer 130 even if contact metallization is somewhat misaligned. Depending on the z-height of source/drain region 140, semiconductor spacer 130 may be covered by more or less source/drain material (e.g., tens of nm to 100 nm, or more).

In some embodiments represented by FIG. 2A, source/drain region 140 forms only one heterojunction 137. No second heterojunction is formed with sub-fin 110 because semiconductor spacer 130 extends over the entire length of sub-fin 110. As described further below, the region of semiconductor spacer 130 disposed between source/drain region 140 and sub-fin 110 is indicative of the technique employed to form semiconductor spacer 130. In some exemplary embodiments, semiconductor spacer 130 thickness between source/drain region 140 and sub-fin 110 is substantially (i.e., +/−10%) equal to the semiconductor spacer thickness $T_s$. This continuous semiconductor spacer thickness $T_s$ over channel region 120 and sub-fin 110 is indicative of a re-growth technique employed to form semiconductor spacer 130, as described further below. Beyond being indicative of the technique employed to form semiconductor spacer 130, the presence of semiconductor spacer 130 between source/drain region 140 and sub-fin 110 may provide advantageous band gap offsets further reducing GIDL current between source/drain region 140 and sub-fin 110. The presence of semiconductor spacer 130 between source/drain region 140 and sub-fin 110 may also provide an advantageous setback between heavily doped source/drain region 140 and sub-fin 110, reducing diffusion of n-type dopants into sub-fin 110 as well as dropping field strength which might otherwise increase leakage current between source/drain region 140 and sub-fin 110.

In some embodiments the current carrying cross-sectional area of a wideband gap semiconductor spacer is substantially equal to the current carrying cross-sectional area of the fin channel region. FIG. 2D illustrates a cross-sectional view through a hetero-fin width along the D-D' plane denoted in FIG. 1, in accordance with some embodiments. The D-D' plane passes through lateral spacing 131 of finFET 101 within semiconductor spacer 130 near where the heterojunction 136 (FIG. 2A) forms an interface with channel region 120 across the transverse fin width $W_f$. As further illustrated in FIG. 2D, semiconductor spacer 130 covers the entire fin z-height $H_f$. In contrast, semiconductor spacer 130 is substantially absent from the majority of sub-fin 110 embedded within sub-fin isolation 115.

Figure 3A:
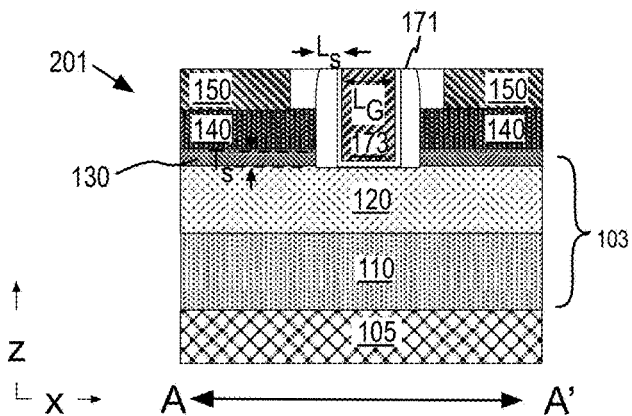
FIG. 3A illustrates a cross-sectional view through a length of channel region and source/drain of the high mobility finFET depicted in FIG. 1, in accordance with some alternate embodiments.
Figure 3B:
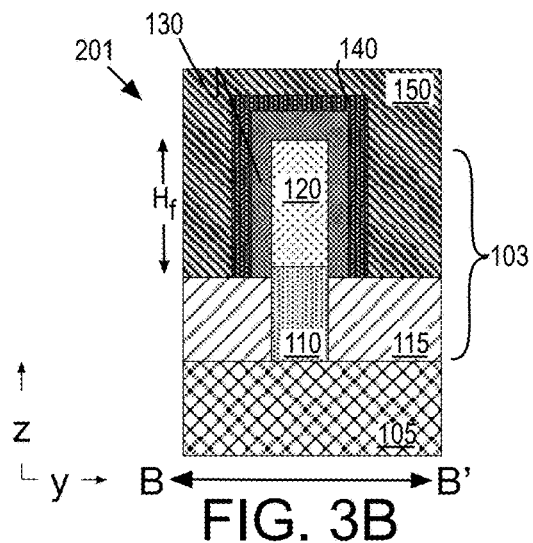
FIG. 3B illustrates a cross-sectional view through a fin width within a source/drain region of the high mobility finFET depicted in FIG. 1, in accordance with some alternate embodiments.
Figure 3C:
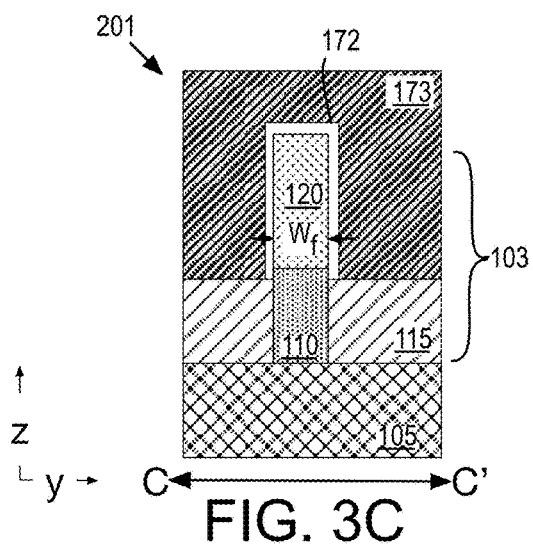
FIG. 3C illustrates a cross-sectional view through a fin width within a channel region of the high mobility finFET depicted in FIG. 1, in accordance with some alternate embodiments.
Figure 4A:
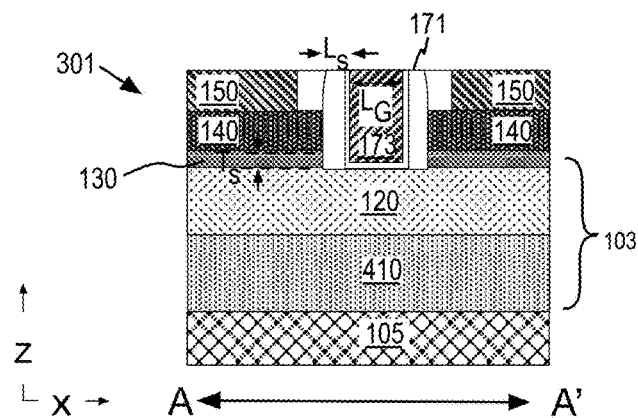
FIG. 4A illustrates a cross-sectional view through a length of channel region and source/drain of a planar high mobility FET, in accordance with some alternate embodiments.
Figure 4B:
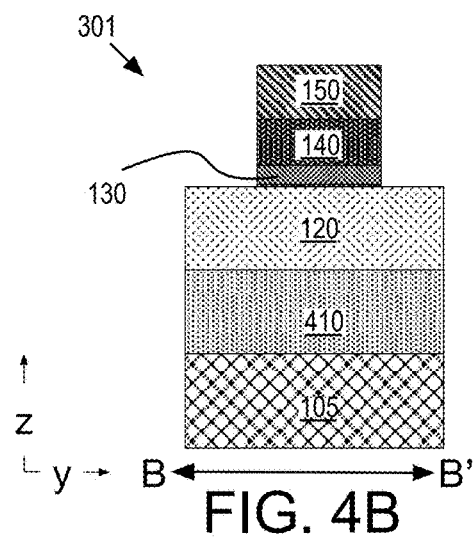
FIG. 4B illustrates a cross-sectional view through a source/drain region of a planar high mobility FET, in accordance with some alternate embodiments.
Figure 4C:
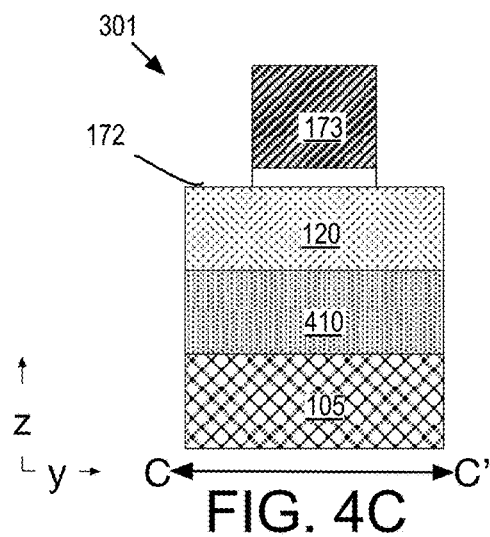
FIG. 4C illustrates a cross-sectional view through a channel region of a planar High mobility finFET, in accordance with some alternate embodiments.
Figure 5:
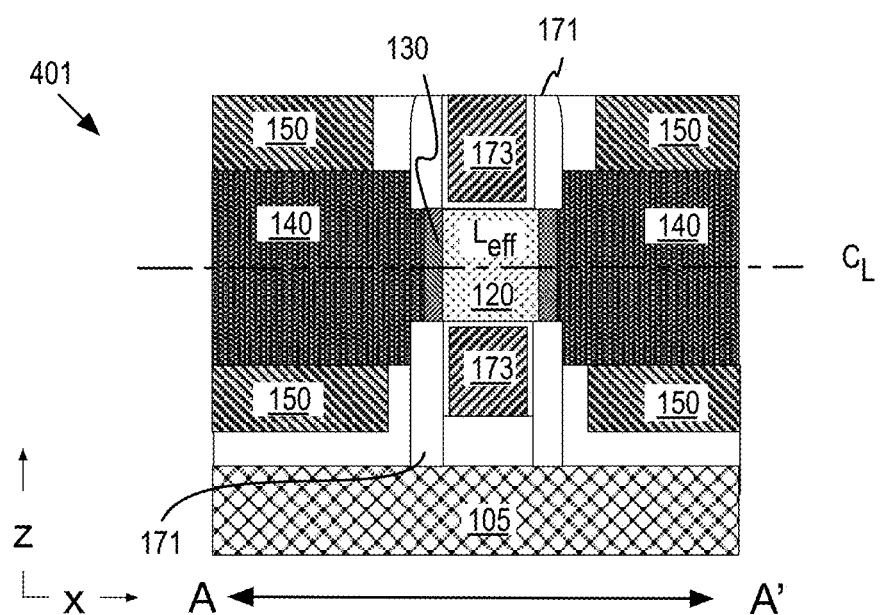
FIG. 5 illustrates a cross-sectional view through a length of channel region and source/drain of a nano-wire high mobility FET, in accordance with some alternate embodiments.

Notably, the architectural elements described above in the context of finFET 101 may be applied to a wide array of other finFET architectures. FIG. 3A-3C, for example, depict a finFET 201 in accordance with some alternate embodiments. FinFET 201 has substantially the same layout/footprint as illustrated for finFET 101 (FIG. 1). However, finFET 201 employs a raised source/drain region 140 disposed over a full-height fin 120 rather than the regrown source/drain region described for finFET 101. As a further example, FIG. 4A-4C depict a planar FET 301 having substantially the same layout/footprint as illustrated for finFET 101 (FIG. 1). As still another example, FIG. 5 depicts a nanowire FET 401 having substantially the same layout/footprint as illustrated for finFET 101 in FIG. 1. Nanowire FET 401 however has a gate stack and source/drain region that wraps completely around a III-V channel material.

FIG. 3A illustrates a cross-sectional view of finFET 201 through the A-A' plane depicted in FIG. 1, in accordance with some alternate embodiments. FIG. 3B illustrates a cross-sectional view of finFET 201 through the B-B' plane depicted in FIG. 1, in accordance with some alternate embodiments. Likewise, FIG. 3C illustrates a cross-sectional view of finFET 201 through the C-C plane depicted in FIG. 1, in accordance with some alternate embodiments. The material thickness $T_s$ associated with semiconductor spacer 130 (FIG. 3A, 3B) offsets raised source/drain region 140 from fin 120. Sub-fin 110, fin 120, and semiconductor spacer 130 may have any of the properties discussed above in the context of finFET 101. For example, spacer 130 may be of a wider band gap III-V material than III-V channel region 120. Source/drain region 140 may again have any of the properties described above in the context of finFET 101 (e.g., heteroepitaxial highly-doped narrow band gap III-V material). Semiconductor spacer 130 forms a shell around end portions of fin 120 and source/drain region 140 forms a shell around semiconductor spacer 130, as further illustrated by FIG. 3B. The profile illustrated in FIG. 3B is applicable over the entire source/drain contact length because the z-height of fin 120 beyond gate sidewall spacer 171 is constant. In some embodiments, semiconductor spacer 130 and source/drain region 140 do not replace any portion of fin 120, and instead are successively epitaxially grown over fin 120. Any of the growth techniques further describe below may be employed to form semiconductors spacer 130, for example as an initial epitaxial growth phase preceding a secondary epitaxial growth phase of raised source/drain region 140.

FIG. 4A illustrates a cross-sectional view of planar FET 301 through the A-A' plane depicted in FIG. 1, in accordance with some alternate embodiments. FIG. 4B illustrates a cross-sectional view of planar FET 301 through the B-B' plane depicted in FIG. 1, in accordance with some alternate embodiments. Likewise, FIG. 4C illustrates a cross-sectional view of planar FET 301 through the C-C plane depicted in FIG. 1, in accordance with some alternate embodiments. Referring first to FIG. 4A, in the context of a planar FET, a III-V buffer layer 410 is disposed over substrate 105. Buffer layer 410 may have any of any of the properties discussed above for sub-fin 110 in the context of finFET embodiments. The film thickness $T_s$ (FIG. 4A) associated with semiconductor spacer 130 offsets raised source/drain region 140 from channel region 120. Channel region 120 and semiconductor spacer 130 may have any of any of the properties discussed above in the context of finFET 201 (e.g., spacer 130 has a carrier-blocking band offset and/or is a wider band gap material relative to channel region 120). Source/drain region 140 may also have any of the properties described above in the context of finFET 101 (e.g., heteroepitaxial highly-doped n-type narrow band gap III-V material). For planar FET 301, semiconductor spacer 130 and even source/drain region 140 may be provided as a blanket III-V epitaxial stack grown at the wafer-level along with III-V buffer 410. Formation of the gate stack may then entail a patterned etch of semiconductor spacer 130 and/or source/drain region 140 to expose channel region 120 in preparation for formation of gate sidewall spacer 171 and deposition of gate electrode 173.

FIG. 5 illustrates a cross-sectional view of nanowire FET 401 through the A-A' plane depicted in FIG. 1, in accordance with some embodiments. As shown, semiconductor spacer 130 is substantially symmetrical about a longitudinal axis CL of channel region 120. In this illustrative embodiment, a sub-fin semiconductor is absent having been completely replaced with gate stack materials, source/drain region 140, and contact metallization 150. With semiconductor spacer 130 formed as an initial phase of source/drain growth, channel region 120 is effectively capped at opposite ends with wide band gap III-V material.

Figure 6:
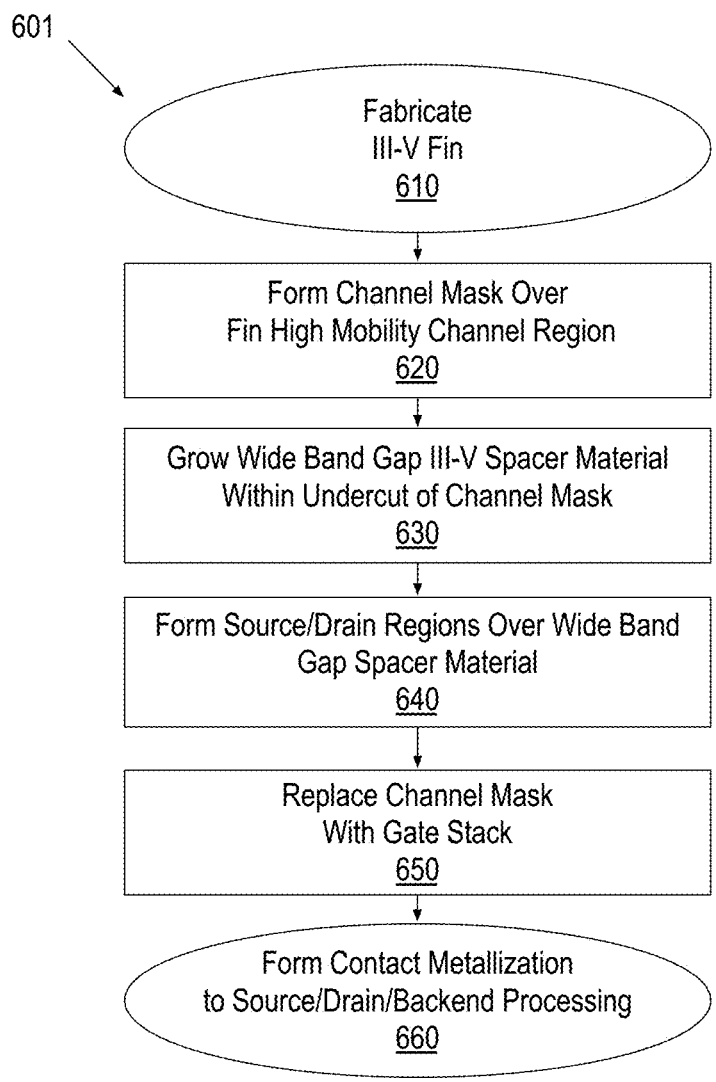
FIG. 6 is a flow diagram illustrating a method of fabricating a high mobility finFET with a wide band gap semiconductor source/drain spacer, in accordance with some embodiments.

High mobility finFETs in accordance with the architectures above may be fabricated by a variety of methods applying a variety of techniques and processing chamber configurations. FIG. 6 is a flow diagram illustrating an exemplary method 601 for fabricating a high mobility finFET with a III-V semiconductor spacer, in accordance with some embodiments. FIGS. 7A, 7B, 7C, 7D, 7E, and 7F illustrate cross-sectional views along the A-A' plane of finFET 101 evolving as the method 601 is performed, in accordance with some embodiments. FIGS. 8A, 8B, 8C, 8D, 8E, and 8F illustrate cross-sectional views along the B-B' plane of finFET 101 evolving as the method illustrated in FIG. 6 is performed, in accordance with some embodiments.

Referring first to FIG. 6, method 601 begins at operation 610 where a fin of III-V semiconductor material is formed. In some embodiments, III-V hetero junction fins are fabricated, for example by epitaxially growing numerous islands of III-V material over a silicon substrate having a plurality of seeding surface regions. In some such embodiments, seeding surface regions are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of lattice mismatch across various heterojunctions. In alternative embodiments, a conventional subtractive technique may be employed in which a blanket III-V film stack is grown over, or transferred to, an entire working surface of a substrate. That blanket III-V film stack is then etched into fin structures similarly amenable to subsequent operations of method 601.

In the exemplary embodiments illustrated by FIGS. 7A and 8A, upon completion of operation 610, hetero-fin 103 is disposed on substrate 105 with at least a portion of channel region 120 extending above a surrounding sub-fin isolation 115 by a z-height $H_f$. In some embodiments, z-height $H_f$ is defined by recess etching a predetermined amount of sub-fin isolation material 115 from around hetero-fin 103. Z-height $H_f$ may vary with the extent of recess etch, potentially exposing sidewalls of sub-fin 110. In alternate embodiments, a stop layer may be utilized to ensure a top surface of sub-fin isolation 115 is flush with the heterojunction between sub-fin 110 and fin 120. At this point, transverse fin width $W_f$ is substantially constant along the entire longitudinal length of a fin.

Returning to FIG. 6, method 601 continues at operation 620 where a channel mask is patterned to protect a portion of the III-V fin that is to become the III-V FET channel region. While any known masking technique and material(s) may be employed at operation 620, in some embodiments, the channel mask is a gate mandrel retained through a number of processes until being replaced in a "gate-last" finFET fabrication flow. Such embodiments may be advantageously compatible with silicon-channeled finFET fabrication, for example enabling PMOS transistors to be concurrently fabricated in other regions of the substrate (not depicted).

In the exemplary embodiment illustrated in FIGS. 7B and 8B, a sacrificial gate 770 is formed over a portion of the hetero-fin 103. Any known sacrificial gate structure and fabrication techniques may be employed at operation 620 to form sacrificial gate 770 on at least two opposing sidewalls of fin 120 (FIG. 8B). Sacrificial gate 770 is patterned into a stripe of sacrificial material extending over channel region 120 and landing on sub-fin isolation 115. Other portions of hetero-fin 103 are exposed. In further embodiments represented by FIG. 7B, the channel mask further includes a gate sidewall spacer 171 adjacent to sacrificial gate 770. Any conventional self-aligned lateral spacer process may be employed at operation 620 to laterally stand-off subsequent processing from sacrificial gate 770. For example, a dielectric (e.g., silicon dioxide and/or silicon nitride) may be conformally deposited over the hetero-fin and over the channel mask. An anisotropic etch is then employed to clear the dielectric except along edged of topography.

In some embodiments, portions of the fin not protected by the channel mask or sub-fin isolation may be recess etched prior to epitaxial overgrowth of band offset semiconductor spacer. In the example illustrated by FIG. 7B, portions fin 120 not protected by the channel mask or sub-fin isolation 115 are recessed etched. This recess etch may undercut lateral spacer 171 by some predetermined amount, or not. A crystallographic wet etchant may be employed or a low damage, chemical dry etchant, for example. In some embodiments, fin 120 is recessed etched selectively to sub-fin 110. Surfaces of fin 120 and/or sub-fin 110 are then prepared for seeding an epitaxial (re)growth.

Returning to FIG. 6, method 601 continues at operation 630 where semiconductor spacer material is epitaxially grown on surfaces of the fin not protected by the channel mask or sub-fin isolation. As further illustrated in FIG. 7C, III-V semiconductor spacer 130 is grown, by any epitaxial growth process. Both the features of the exposed fin portions and characteristics of the overgrowth process may be utilized to properly stand off or offset subsequently formed source/drain regions from narrow band gap channel semiconductor material. In some embodiments, the wide band gap semiconductor spacer material is grown substantially as a first phase of a source/drain overgrowth. Both composition and in-situ doping may be modulated to first grow a desured spacer material and then grow narrow band gap source/drain material. Any of metal-organic chemical vapor deposition (MOCVD), molecular beam epitaxy (MBE), hydride vapor phase epitaxy (HVPE), or the like, may be employed to grow semiconductor spacer material with or without in-situ doping.

Upon completing overgrowth of the band offset semiconductor spacer, method 601 proceeds to operation 640 where semiconductor source/drain regions are formed. In some embodiments of operation 640, the epitaxially re-growth and/or overgrowth of fin 120 initiated at operation 630 is continued. Instead of being substantially undoped however, a heavily-doped semiconductor is grown. In further embodiments, heavily-doped III-V semiconductor of a different composition than that of semiconductor spacer 130, and of fin 120, is heteroepitaxially grown from seeding surfaces of semiconductor spacer 130. Any known epitaxial source/drain regrowth technique may be employed. In exemplary embodiments further illustrated in FIGS. 7D and 8D, a single crystalline heteroepitaxial source/drain region 140 is grown. This material (e.g., high In content InGaAs, InAs, or other III-V material) may be heavily in-situ doped (e.g., n-type).

Returning to FIG. 6, method 601 continues at operation 650 where the channel mask is replaced with a permanent gate stack. Method 601 is then substantially completed with any suitable contact metallization and backend processing performed at operation 660. For the exemplary embodiment further illustrated in FIGS. 7E and 8E, finFET isolation 180 is deposited and planarized to expose a top of sacrificial gate 770. Sacrificial gate 770 is removed selectively relative to isolation 180, thereby exposing the lateral channel region of fin 120. A permanent gate stack including a gate dielectric 172 and gate electrode 173 is formed over at least two sidewalls of the fin structures, as depicted in FIGS. 7F and 8F. While any known gate stack materials may be utilized, in one exemplary embodiment a high-k dielectric material is deposited along with a metal gate electrode having a work function suitable for the III-V composition of fin 120. As further illustrated in FIGS. 7F and 8F, source/drain contact metallization 150 is formed by any known technique (e.g., Ti/TiN deposition). The structure of finFET 101 is then substantially as introduced in FIGS. 1 and 2A-2D, and is ready for backend processing following any known techniques.

Figure 9:
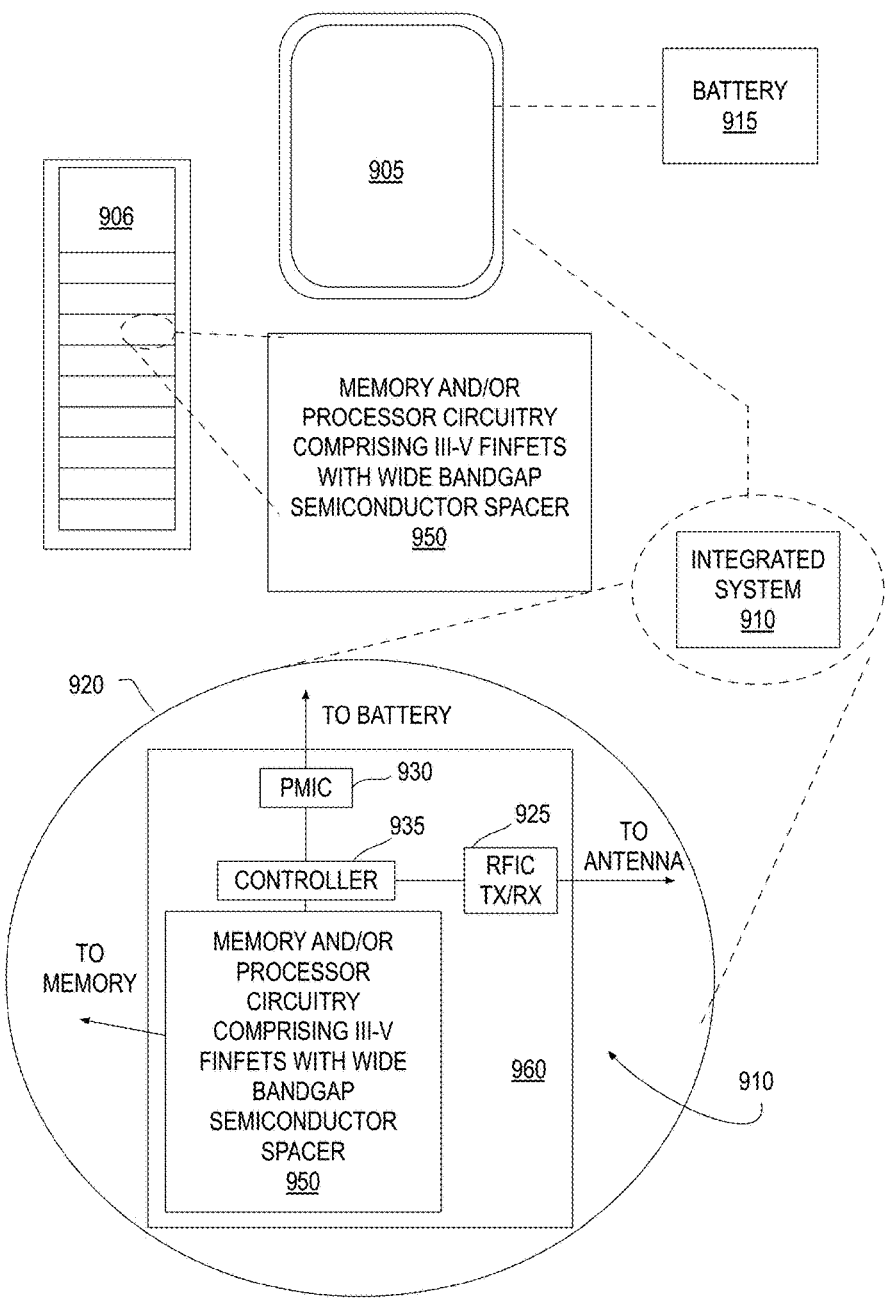
FIG. 9 illustrates a mobile computing platform and a data server machine employing an SoC including a plurality of high mobility finFETs including a wide band gap III-V semiconductor source/drain spacer, in accordance with embodiments of the present invention.

FIG. 9 illustrates a mobile computing platform and a data server machine employing an SoC including high mobility finFETs with a band-offset and/or wide band gap III-V semiconductor spacer, for example as describe elsewhere herein. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, packaged monolithic SoC 950 includes a memory block (e.g., RAM), a processor block (e.g., a microprocessor, a multi-core microprocessor, graphics processor, or the like) including at least one III-V n-type finFET with a band-offset and/or wide band gap III-V semiconductor spacer, for example as describe elsewhere herein. The monolithic SoC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 950.

Figure 10:
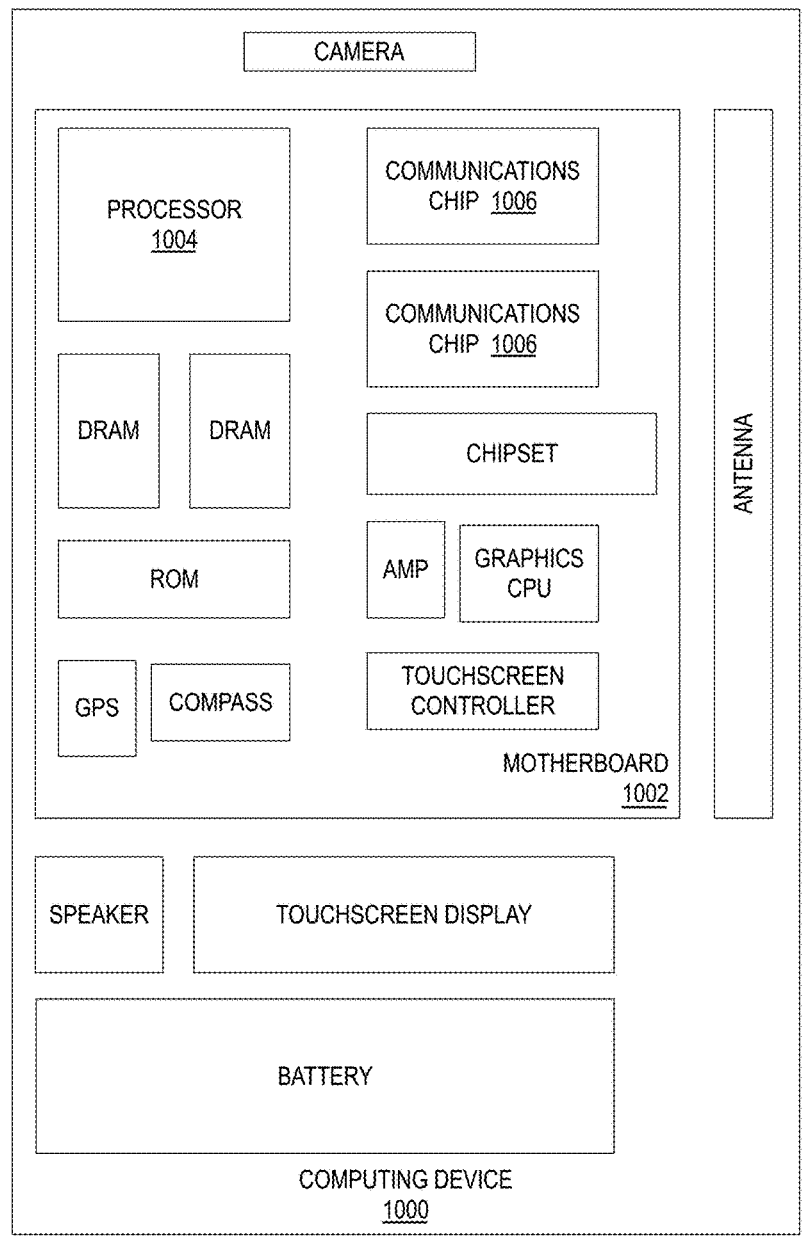
FIG. 10 is a functional block diagram of an electronic computing device, in accordance with an embodiment of the present invention.

FIG. 10 is a functional block diagram of an electronic computing device, in accordance with an embodiment of the present invention. Computing device 1000 may be found inside platform 905 or server machine 906, for example. Device 1000 further includes a motherboard 1002 hosting a number of components, such as, but not limited to, a processor 1004 (e.g., an applications processor), which may further incorporate at least one high mobility finFET with a wide band gap III-V semiconductor spacer, for example as describe elsewhere herein. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a monolithic high mobility field effect transistor comprises a gate electrode disposed over a semiconductor channel region comprising a first III-V semiconductor material. The transistor further includes a semiconductor source region and a semiconductor drain region, each comprising a second III-V semiconductor material. The transistor further includes a first semiconductor spacer disposed between the semiconductor channel region and at least the semiconductor drain region, the first semiconductor spacer comprising a third III-V semiconductor material having a charge carrier-blocking band offset from the first III-V semiconductor material.

In furtherance of the first embodiments, the transistor further comprises a second semiconductor spacer disposed between the channel region and the semiconductor source region, the second semiconductor spacer also comprising the third III-V semiconductor material.

In furtherance of the first embodiments, the source and drain regions are laterally spaced apart from opposite sidewalls of the gate electrode by an intervening gate sidewall spacer. A first heterojunction between the first and second III-V semiconductor materials is disposed below the gate electrode or below the gate sidewall spacer. The first semiconductor spacer has a cross-sectional area at least equal to that of the fin.

In furtherance of the first embodiments immediately above, the fin of the first III-V compound semiconductor material disposed over a sub-fin of a fourth III-V compound semiconductor material disposed between the first III-V compound semiconductor and the substrate, and the semiconductor drain region is disposed over the sub-fin, the second III-V semiconductor material being separated from the fourth III-V compound semiconductor by the first semiconductor spacer.

In furtherance of the first embodiments, the semiconductor spacer has a film thickness less than 20 nm.

In furtherance of the first embodiments, the semiconductor spacer comprises a 2-5 nm thickness of the third III-V semiconductor material.

In furtherance of the first embodiments, the third semiconductor material has a conduction band energy higher than that of the first semiconductor material by at least 0.1 eV.

In furtherance of the first embodiments immediately above, the first and second III-V semiconductor materials both comprise Ga alloys or As alloys, and at least one of: the first III-V semiconductor has a higher concentration of In or Sb than the second III-V semiconductor material; or the second III-V semiconductor material has a higher concentration of Al or P than the first III-V semiconductor material; or one of the first and second III-V semiconductor materials is InP and the other of the first and second III-V semiconductor materials is a Ga alloy or As alloy; or the first and second III-V semiconductor materials both comprise In alloys or P alloys, and at least one of: the first III-V semiconductor has a higher concentration of As than the second III-V semiconductor material, or the second III-V semiconductor material has a higher concentration of Al or Ga than the first III-V semiconductor material.

In furtherance of the first embodiments immediately above, the first and second III-V semiconductor materials both comprise Ga alloys or As alloys, the first III-V semiconductor having a higher concentration of In than the second III-V semiconductor material.

In furtherance of the first embodiments immediately above, the first III-V semiconductor material comprises $In_{0.53}Ga_{0.47}As$, the second III-V semiconductor material comprises an $In_xGa_{1-x}As$ alloy where x is no more than 0.4, and the third III-V semiconductor material comprises and $In_xGa_{1-x}As$ alloy where x is more than 0.8.

In furtherance of the first embodiments, the substrate is monocrystalline silicon, the gate sidewall spacer comprises a high-K gate insulator disposed between the gate electrode and channel region, and the gate electrode comprises a metal gate electrode.

In one or more second embodiments, a CMOS integrated circuit (IC), comprises a silicon substrate, a p-type finFET disposed over a the substrate, and an n-type channeled finFET disposed the substrate. The n-type finFET further includes a gate stack disposed over a channel region comprising a first III-V semiconductor material. The n-type finFET further includes a source region and a drain region, each comprising a second III-V semiconductor material having a band gap no wider than the first III-V semiconductor material. The n-type finFET further includes a first semiconductor spacer disposed between the semiconductor channel region and at least the semiconductor drain region, the first semiconductor spacer comprising a third III-V semiconductor material having a charge carrier-blocking conduction band offset from the first III-V semiconductor material.

In furtherance of the second embodiments, the high mobility finFET further comprises a second semiconductor spacer disposed between the channel region and the source region, the second semiconductor spacer also comprising the third III-V semiconductor material. The third III-V semiconductor material has a conduction band offset from the first III-V semiconductor material and a wider band gap than the first III-V semiconductor material. The p-type finFET comprises a silicon fin.

In furtherance of the second embodiments immediately above, the source and drain regions are laterally spaced apart from opposite sidewalls of the gate stack by an intervening gate sidewall spacer. The first and second semiconductor spacers are both disposed below the gate sidewall spacer on opposite ends of the channel region, and a first heterojunction between the first and second III-V semiconductor materials is disposed below the gate stack or below the gate sidewall spacer.

In one or more third embodiments, a method of fabricating a high mobility fin field effect transistor (FET), the method comprises: forming a fin disposed on a substrate, the fin comprising a first semiconductor material, forming a mask over a channel region of the fin, epitaxially growing a semiconductor spacer on an unmasked portion of the fin, the semiconductor spacer comprising a second semiconductor material having a charge carrier-blocking band offset from the first semiconductor material, and forming a semiconductor source region and a semiconductor drain region over the semiconductor spacer, the semiconductor source and drain regions comprising a third semiconductor material having a narrower band gap than the second semiconductor material.

In furtherance of the third embodiments, epitaxially growing the semiconductor spacer further comprises recess etching a portion of the first semiconductor material not covered by the mask to expose ends of the fin channel region, and epitaxially growing a monocrystalline layer of the second semiconductor material over the exposed fin ends.

In furtherance of the third embodiments immediately above, epitaxially growing the monocrystalline layer of the second semiconductor material over the fin ends further comprises growing a second III-V semiconductor material to a thickness of 2-20 nm.

In furtherance of the third embodiments immediately above, recess etching the first III-V semiconductor material exposes a surface of a sub-fin disposed below the fin, the sub-fin further comprising a fourth III-V semiconductor material, and the method further comprises epitaxially growing the second III-V semiconductor material on an exposed sub-fin surface comprising the fourth semiconductor material.

In furtherance of the third embodiments, forming the mask over the channel region further comprises depositing a sacrificial gate stack, patterning the sacrificial gate stack into a stripe extending over the channel region, and forming a dielectric gate sidewall spacer adjacent to sidewalls of the sacrificial gate stack stripe.

In furtherance of the third embodiments, the method further comprises removing the channel region masking, forming a gate stack over the channel region, and forming contact metallization to the semiconductor source and drain regions.

In furtherance of the third embodiments, forming the fin further comprises forming a fin of an InGaAs alloy having a first In concentration, forming semiconductor spacer further comprises forming a spacer of an InGaAs alloy having a second In concentration, lower than the first In concentration, and forming the semiconductor source and drain regions further comprises forming source and drain regions of an InGaAs alloy having a third In concentration, higher than the first In concentration.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A field effect transistor, comprising:
a gate electrode over a channel region, the channel region comprising a first III-V semiconductor material with a first impurity concentration, wherein the first III-V semiconductor material is $In_{0.53}Ga_{0.47}As$;
a source region and a drain region, each comprising a second III-V semiconductor material doped to a same conductivity type with a second impurity concentration that is greater than the first impurity concentration, and wherein the second III-V semiconductor material comprises a higher concentration of In than the first III-V semiconductor material;
a first semiconductor spacer between the channel region and the drain region, the first semiconductor spacer comprising a third III-V semiconductor material, wherein the third III-V semiconductor material has an impurity concentration substantially the same as the first impurity concentration, and the third III-V semiconductor material is an $In_xGa_{1-x}As$ alloy in which x is no more than 0.4; and
a second semiconductor spacer between the channel region and the source region, the second spacer also comprising the third III-V semiconductor material.

2. The transistor of claim 1, wherein:
the source and drain regions are laterally spaced apart from opposite sidewalls of the gate electrode by an intervening gate sidewall spacer;
a first heterojunction between the first and second III-V semiconductor materials are below the gate electrode or below the gate sidewall spacer; and
the first semiconductor spacer has a cross-sectional area at least equal to that of a fin comprising the channel region.

3. The transistor of claim 2, wherein:
the first III-V semiconductor material comprises a fin of the first III-V semiconductor material that is over a sub-fin of a fourth III-V semiconductor material that is between the first III-V semiconductor material and a substrate underlying the fourth III-V semiconductor material;
the drain region is over the sub-fin, the second III-V semiconductor material being separated from the fourth III-V compound semiconductor by the first semiconductor spacer, and
the source region is over the sub-fin, the second III-V semiconductor material being separated from the fourth III-V compound semiconductor by the second semiconductor spacer.

4. The transistor of claim 3, wherein:
the substrate is monocrystalline silicon;
the channel region and semiconductor spacers are monocrystalline;

the gate sidewall spacer comprises a high-K gate insulator between the gate electrode and the channel region; and
the gate electrode comprises a metal gate electrode.

5. The transistor of claim 1, wherein the first semiconductor spacer has a film thickness less than 20 nm.

6. The transistor of claim 5, wherein the first semiconductor spacer comprises a 2-5 nm thickness of the third III-V semiconductor material.

7. A CMOS integrated circuit (IC), comprising:
a silicon substrate;
the transistor of claim 1 over a first region of the substrate, wherein the conductivity type is n-type;
a p-type transistor over a second region of the substrate.

8. The CMOS IC of claim 7, wherein
the p-type transistor comprises a silicon fin.

9. The CMOS IC of claim 8, wherein:
the source and drain regions are laterally spaced apart from opposite sidewalls of the gate stack by an intervening gate sidewall spacer;
the first and second semiconductor-spacers are both below the gate sidewall spacer on opposite ends of the channel region; and
a first heterojunction between the first and second III-V semiconductor-materials is below the gate stack or below the gate sidewall spacer.

10. A method of fabricating a field effect transistor (FET), the method comprising:
forming a fin over a substrate, the fin comprising a first III-V semiconductor material with a first impurity concentration, wherein the first III-V semiconductor material is $In_{0.53}Ga_{0.47}As$;
forming a mask over a channel region of the fin;
epitaxially growing a semiconductor spacer on an unmasked portion of the fin, the semiconductor spacer comprising a second III-V semiconductor material having a charge carrier-blocking band offset from the first semiconductor material wherein the second III-V semiconductor material has an impurity concentration substantially the same as the first impurity concentration, and the second III-V semiconductor material is an $In_xGa_{1-x}As$ alloy in which x is no more than 0.4; and
forming a source region and a drain region over the semiconductor spacer, the source and drain regions comprising a third III-V semiconductor material having a narrower band gap than the second semiconductor material, wherein the third III-V semiconductor material comprises a higher concentration of In than the first III-V semiconductor material, and the third III-V semiconductor material has a second impurity concentration that is greater than the first impurity concentration.

11. The method of claim 10, wherein epitaxially growing the semiconductor spacer further comprises:
recess etching a portion of the first semiconductor material not covered by the mask to expose ends of the channel region; and
epitaxially growing a monocrystalline layer of the second semiconductor material over the ends of the channel region.

12. The method of claim 11, wherein:
epitaxially growing the monocrystalline layer of the second III-V semiconductor material comprises growing the second III-V semiconductor material to a thickness of 2-20 nm.

13. The method of claim 12, wherein recess etching the first III-V semiconductor material exposes a surface of a sub-fin below the fin, the sub-fin further comprising a fourth III-V semiconductor material; and
the method further comprises epitaxially growing the second III-V semiconductor material on an exposed sub-fin surface comprising the fourth semiconductor material.

14. The method of claim 10, wherein forming the mask over the channel region further comprises:
depositing a sacrificial gate stack;
patterning the sacrificial gate stack into a stripe extending over the channel region; and
forming a dielectric gate sidewall spacer adjacent to sidewalls of the sacrificial gate stack stripe.

15. The method of claim 10, further comprising:
removing the mask from over the channel region;
forming a gate electrode over the channel region; and
forming contact metallization to the source and drain regions.

* * * * *